United States Patent
Sakamoto et al.

(10) Patent No.: US 6,592,987 B1
(45) Date of Patent: Jul. 15, 2003

(54) WHOLLY AROMATIC SYNTHETIC FIBER PRODUCED BY LIQUID-CRYSTAL SPINNING, PROCESS FOR PRODUCING THE SAME, AND USE THEREOF

(75) Inventors: Shiro Sakamoto, Yokohama (JP); Hiroyuki Suzuki, Utsunomiya (JP)

(73) Assignee: E. I. du Pont de Namours and Company, Wilmington, DE (US)

( * ) Notice: Subject to any disclaimer, the term of this patent is extended or adjusted under 35 U.S.C. 154(b) by 0 days.

(21) Appl. No.: 09/508,134

(22) PCT Filed: Sep. 9, 1998

(86) PCT No.: PCT/JP98/04041

§ 371 (c)(1),
(2), (4) Date: Mar. 7, 2000

(87) PCT Pub. No.: WO99/13140

PCT Pub. Date: Mar. 18, 1999

(30) Foreign Application Priority Data

Sep. 9, 1997  (JP) .............................................. 9-262753

(51) Int. Cl.[7] .................................................. D01F 6/00
(52) U.S. Cl. .................. 428/364; 428/394; 428/395
(58) Field of Search ................................ 428/364, 394, 428/395

(56) References Cited

U.S. PATENT DOCUMENTS

| | | | | |
|---|---|---|---|---|
| 3,624,247 A | * | 11/1971 | Sarnia et al. | ............... 260/29.3 |
| 3,767,756 A | | 10/1973 | Blades | |
| 3,869,429 A | | 3/1975 | Blades | |
| 3,869,430 A | | 3/1975 | Blades | |
| 5,296,185 A | | 3/1994 | Chau et al. | |
| 5,436,301 A | | 7/1995 | Nishimura et al. | |
| 5,525,638 A | | 6/1996 | Sen et al. | |
| 5,654,358 A | * | 8/1997 | Kadoi et al. | ................. 524/505 |

FOREIGN PATENT DOCUMENTS

| | | |
|---|---|---|
| GB | 1 393 011 | 5/1975 |
| JP | 02084509 | 3/1990 |
| WO | WO 94/23099 A1 | 10/1994 |

* cited by examiner

Primary Examiner—N. Edwards

(57) ABSTRACT

Wholly aromatic synthetic fibers spun from liquid-crystalline polymer solutions, having a crystal size (110 plane) of not greater than 50 Å and an ionic substance content of no more than 1.0 wt % are disclosed.

Said fibers having a low ionic substance content while retaining the inherent high heat resistance and high Young's modulus, and are useful particularly for electrical and electronic parts.

10 Claims, No Drawings

WHOLLY AROMATIC SYNTHETIC FIBER PRODUCED BY LIQUID-CRYSTAL SPINNING, PROCESS FOR PRODUCING THE SAME, AND USE THEREOF

DESCRIPTION

TECHNICAL FIELD OF THE INVENTION

The present invention relates to wholly aromatic synthetic fibers spun from a liquid-crystalline polymer solution, such as polyparaphenylene terephthalamide fibers having a low ion content, a high Young's modulus, good dimensional stability, excellent heat resistance and insulating properties; process for preparing the same and use of said fibers.

BACKGROUND OF THE INVENTION

Wholly aromatic synthetic fibers spun from liquid-crystalline polymer solutions have been heretofore used as industrial fibers or fibers for special-purpose clothing because of their excellent heat resistance and high Young's modulus. Polyparaphenylene terephthalamide (PPTA) fibers and polyparaphenylene benzobisoxazole (PBO) fibers, for example, are known as the representative of such wholly aromatic synthetic fibers spun from liquid-crystalline polymer solutions.

According to known preparation process of PPTA and PBO fibers, the polymers are converted to liquid-crystalline state with strong acid which is used as a solvent for dissolving the polymers to make spinning solutions, and then subjected to shearing force exerted by a spinneret to be shaped into fibers of high crystalline orientation. Immediately after the spinning, the as-spun fibers are washed with water and treated with alkali to neutralize conc. Sulfuric acid or phosphoric acid which is used as the solvent, dried and heat-treated at temperatures not lower than 150° C., and thereafter wound up as filaments (cf. U.S. Pat. Nos. 3,767, 756 and 5,296,185).

U.S. Pat. No. 3,869,430 (Japanese Patent Publication No. 14567/1984) also disclosed a preparation method of filaments, in which as-spun fibers spun from a liquid-crystalline polymer solution is given a neutralizing treatment with an alkali, and then washed with water. The crystal size of the polyamide fibers before a heat treatment which are obtained according to the same patent exceeds 50 Å, when calculated based on the X-ray diffraction method specifically described therein.

The fibers so obtained contain, as incorporated therein, the salt or salts formed by the neutralization and normally the salt content of the fibers ranges 0.5 to 3 wt %. For example, when sulfuric acid is used as the solvent and sodium hydroxide is used for the neutralization, the ions constituting the salt are mainly $Na^+$ and $SO_4^{2-}$, their mol ratio being approximately 2:1.

This salt is apt to be ionized in the presence of water when the fibers are used under highly humid conditions, to deteriorate insulation property of the fibers. This causes a problem when the fibers are put to uses where electrical insulation property is required.

On the other hand, it is known that paper, rope, cord or textile produced from PPTA or PBO fibers exhibit excellent characteristics such as good dimensional stability, processability, high Young's modulus and low shrinkage under high temperature treatments attributable to their polymeric structures, as insulating and low-dielectric materials when used as electronic insulation materials. However, when used in applications requiring high insulation property, for example, a material for electric circuit substrate, there is the possibility that the ionic substance induces migration as above, which has incurred restrictions on development of their further usage.

The purpose of the present invention is to solve the aforesaid problems in prior art and to provide wholly aromatic synthetic fibers spun from liquid-crystalline polymer solutions, which, while maintaining the high heat resistance and high Young's modulus inherent in wholly aromatic synthetic fibers such as PPTA and PBO fibers, also have a low ionic substance content and, in particular, are useful as electrical and electronic parts, a process for their preparation and uses thereof.

DISCLOSURE OF THE INVENTION

It is an object of this invention to provide wholly aromatic synthetic fibers spun from liquid-crystalline polymer solution, process for their preparation and use thereof, which are characterized by the features as summarized below:

(1) wholly aromatic synthetic fibers spun from liquid-crystalline polymer solutions characterized by having a crystal size (110 plane) of 50Å or less and an ionic substance content of 1.0 wt % or less;

(2) wholly aromatic synthetic fiber according to (1) above, wherein said wholly aromatic synthetic fiber spun from a liquid-crystalline polymer solution is polyparaphenylene terephthalamide fiber;

(3) wholly aromatic synthetic fiber according to (1), wherein said wholly aromatic synthetic fiber spun from a liquid-crystalline polymer solution is polyparaphenylene benzobisoxazole fiber;

(4) wholly aromatic synthetic fiber according to any one of (1) to (3), whose moisture content ranges 15–300 wt %;

(5) Wholly aromatic synthetic fibers wherein the ionic substance content of the fibers described in any one of (1) to (4) is reduced to 0.2 wt % or less by a deionization treatment;

(6) wholly aromatic synthetic fiber having a crystal size larger than 50 Å, which is obtained by heat treating the fiber of (5) above;

(7) A process for manufacturing polyparaphenylene terephthalamide fibers, which is characterized by spinning and neutralizing a sulfuric acid solution of polyparaphenylene terephthalamide, adjusting the moisture content of the resulting fibers to 15 to 300 wt %., and thereafter subjecting the same to a deionizing treatment, without an intervening heat treatment.

(8) A process for manufacturing polyparaphenylene terephthalamide fibers, characterized by heat-treating the polyparaphenylene terephthalamide fibers obtained through the manufacturing process of (7) above at 150 to 500° C.

(9) A process for manufacturing polyparaphenylene benzobisoxazole fibers, which is characterized by spinning and neutralizing a phosphoric acid solution of polyparaphenylene benzobisoxazole, adjusting the moisture content of the resulting fibers to 15 to 300 wt %., and thereafter subjecting the same to a deionizing treatment, without an intervening heat treatment.

(10) A process for manufacturing polyparaphenylene benzobisoxazole fibers, characterized by heat-treating the polyparaphenylene benzobisoxazole fibers obtained through the manufacturing process of (9) above at 150 to 700° C.

(11) Insulating and low dielectric materials characterized by comprising the wholly aromatic synthetic fibers which are described in (5).

(12) Cord characterized by comprising the wholly aromatic synthetic fibers which are described in (5).

(13) Fabric characterized by comprising the wholly aromatic synthetic fibers which are described in (5).

(14) A sheet-form structure for an electric circuit substrate characterized by comprising wholly aromatic synthetic fibers which are described in (5).

Hereinafter the invention is described in further details.

DETAILED DESCRIPTION OF THE INVENTION

This invention provides wholly aromatic synthetic fibers spun from liquid-crystalline polymer solutions which have a crystal size (110 plane) of 50 Å or less and an ionic substance content of 1.0 wt % or less.

The term "wholly aromatic synthetic fibers spun from liquid-crystalline polymer solutions" used herein means synthetic fibers obtained by spinning a liquid-crystalline solution of a wholly aromatic polymer or copolymer such as a wholly aromatic polyamide. The kind of wholly aromatic polymer or copolymer is subject to no critical limitation, so long as its liquid-crystalline solution is spinnable into fibers. According to the present invention, PPTA fibers and PBO fibers are preferred as the wholly aromatic fibers obtained by spinning a liquid-crystalline solution, in particular, the former of the two, i.e., PPTA fibers are the most desirable. Accordingly, hereinafter the invention is explained referring mainly to PPTA fibers, but it should be understood that the invention is in no sense limited to PPTA fibers only, but is similarly applicable to any other wholly aromatic synthetic fibers obtained by spinning liquid-crystalline solutions of wholly aromatic polymers or copolymers.

PPTA useful in the present invention is a polymer obtainable, for example, through polycondensation of terephthalic acid and paraphenylenediamine, which may contain a minor amount of other dicarboxylic acid and/or diamine as copolymerized therewith. It is normally preferred for the resulting polymer or copolymer to have a number average molecular weight within a range of 20,000–25,000.

PBO is a polymer obtained, for example, by polycondensation of terephthalic acid and diaminoresorcin and normally the resulting polymer has a number average molecular weight of 30,000–50,000. Formation of PPTA or PBO fibers can be practiced by spinning of their liquid-crystalline solutions by a method known per se. For example, by dissolving PPTA or PBO in concentrated sulfuric acid or phosphoric acid to form a viscous solution containing 18 to 20 wt % of such a polymer, discharging the solution through a spinneret and spun into a gaseous medium such as air, nitrogen, argon, helium, carbon dioxide or the like which fills a narrow gap between the spinneret and a coagulant bath, and then into water which is used as the coagulant. In that occasion, the shear rate at the discharge time from the spinneret is preferably made 25,000 to 50,000 sec$^{-1}$. When the polymer used is PPTA, the fibers subsequently coagulated in spinning bath are given a neutralization treatment with an aqueous sodium hydroxide solution, and then dried at 100–150° C., preferably for 5–20 seconds. Where PBO is used, the fibers coagulated in the spinning bath are washed with an aqueous phosphoric acid solution and water, and then dried.

Thus obtained wholly aromatic synthetic fibers generally have a crystal size of 50Å or less, preferably within a range of 35–45Å. When such fibers are heat-treated at temperatures ranging 150–700° C., preferably 150–500° C., their crystal size exceeds 50 Å, becoming in the order of 55–75 Å.

The desirable moisture content of so obtained PPTA fibers before the heat treatment generally ranges 15–300 wt %, in particular, 20–70 wt %.

According to the present invention, wholly aromatic synthetic fibers spun from liquid-crystalline polymer solutions as above, eg., PPTA or PBO fibers, preferably have an ionic substance content of not more than 1.0 wt %, more preferably not more than 0.5 wt %, inter alia, not more than 0.2 wt %, before the heat treatment. The adjustment of the content of ionic substance in the fibers can be effected by, for example, controlling the concentration values in said aqueous sodium hydroxide or phosphoric acid solution used for neutralizing the spun fibers or conditions (eg. temperature, time) of the neutralizing treatment, and/or by subjecting the fibers to a deionizing treatment.

The term, "ionic substance", as used herein refers to such substances which are readily electrolyzed in a polar solvent such as water or ammonia to generate ions, eg., $Na^+$, $K^+$ and the like. As examples of such substances, salts like sodium sulfate, sodium chloride, sodium phosphate and calcium sulfate can be named. These ionic substances are composed mainly of the strong acids and their neutralizing agents used in the spinning process, and hence the kind of specific salt present in individual fibers can generally be readily known, which allows determination of content of the ionic substance by quantification of the alkali metal forming the salt.

Deionizing treatment of the wholly aromatic synthetic fibers before a heat treatment as obtained in above can be effected in the following manner. For example, wholly aromatic synthetic fibers which have been spun in the above-described manner, whose crystal size, moisture content, etc. are adjusted, may be washed in, or extracted with, water of around 20° C. for at least 5 minutes, preferably for 30 minutes to 1 hour. With such a deionizing treatment, ionic substance content of the fibers can be reduced to not higher than 0.2 wt %.

Thus obtained wholly aromatic synthetic fibers of low ionic substance content are then heat-treated at 150–700° C., preferably 150–500° C., whereby their crystal size is controlled to at least 50Å, preferably in the range of 55–75 Å.

Thus obtained wholly aromatic synthetic fibers of low ionic substance content, which have been suitably heat-treated, are useful for various usages. For example, staple fibers of a wholly aromatic synthetic fibers according to the present invention, as cut into short lengths, may be mixed with, for example, a binder formed of a thermosetting resin or pulp-formed particles or staple fibers at a prescribed ratio, dispersed in water and subjected to a paper-making method known per se, to provide fibrous paper. This fibrous paper exhibits the excellent properties of the wholly aromatic synthetic fibers and also has high insulation properties because its ionic substance content such as of sodium sulfate is low. This combination of properties render the paper optimum for use in electrical and electronic parts.

The wholly aromatic synthetic fibers of the present invention are also useful for making cord, textile, knit goods, fabrics such as non-woven fabrics, and furthermore sheet-form structure for electric circuit substrate, where their excellent properties are utilized. In particular, by further processing said fibrous paper containing a wholly aromatic synthetic fiber of low ionic substance content of the present invention to secure in them the properties required for an electric circuit substrate, eg., such processing comprising thermal working with a calendering machine, impregnation with thermosetting epoxy resin varnish to form a prepreg and lamination and shaping of the prepreg to form an electric circuit substrate, a sheet-form structure for electric circuit substrate excelling in electrical insulation property can be provided.

Hereafter the invention is more specifically explained, referring to Examples. The physical properties indicated in the Examples were measured by the following methods.

(a) Ionic Substance Content

Taking an example of PPTA, the typical ionic substance contained therein is sodium sulfate. Sodium metal in said salt was determined by the following method.

About 0.5 g of a sample fiber was taken onto a platinum dish, dissolved in sulfuric acid and ashed with a gas burner and an electric oven. Thus obtained ash was heated with sulfuric acid, nitric acid and hydrofluoric acid, to be decomposed. The decomposition product was dissolved in diluted nitric acid to provide a constant-volume solution. Sodium metal determination in the constant-volume solution was conducted by atomic absorption spectrochemical analysis.

(b) Moisture Content

About 5 g of a sample was precisely weighed, subjected to a heat treatment of 300° C. ×20minutes, allowed to stand for 5 minutes under normal state and weighed again.

The moisture content indicated is the dry base moisture content calculated by the equation below:

$$\text{Moisture content} = \frac{[\text{Weight before drying}] - [\text{Weight after drying}]}{[\text{Weight after drying}]}$$

(c) Crystal Size

Samples were adjusted to have each a size of 4 cm in length and 20 mg in weight and hardened with a collodion solution, from which data were taken using wide-angle X-ray diffraction (diffractometer) method. Of the so obtained 2θ/θ intensity data, crystal size was calculated from half-value width in 110 plane according to Scherrer's equation.

(d) Insulation Reliability after Moisture Absorption

Wholly aromatic synthetic fibers obtained by the process of this invention or other processes were cut into staple fibers, hot press processed into fibrous papers by papermaking with a binder, impregnated with a varnish of an epoxy resin composition and dried to provide pregregs which were serviceable as substrates of printed circuit boards. The substrates were laminated and shaped into circuit boards incorporated with copper foil and having a comb-formed electrode. Those circuit boards were allowed to stand for 500 hours and 1000 hours in a high temperature and high humidity atmosphere of 60° C. and 95% RH, while being applied a DC voltage of 20V. Thus treated circuit boards were returned to their normal state in an atmosphere of 20° C. and 60% RH. A DC voltage of 35V was applied for 60 seconds to the combformed electrodes of the circuit boards which had been left in said high temperature-high humidity atmosphere for zero hour, 500 hours and 1,000 hours, to measure their insulation resistance values, and each the minimum resistance value was recorded.

EXAMPLE 1

One (1) kg of PPTA (molecular weight: approx. 20,000) obtained by a normal method was dissolved in 4 kg of conc. sulfuric acid, discharged through a spinneret having 1000 holes of 0.1 mm in diameter at a shear rate of 30000 sec$^{-1}$, spun into water of 4° C., then subjected to a neutralization treatment in a 10% aqueous solution of sodium hydroxide under the conditions of 10° C. ×15 seconds and then to a low-temperature drying at 110° C. ×15 seconds to produce wholly aromatic synthetic fibers not yet subjected to a deionizing treatment.

The properties of these wholly aromatic synthetic fibers are shown in Table 1.

These wholly aromatic synthetic fibers before any deionizing treatment were then treated with water under the conditions of 20° C. ×1 hour and deionized, followed by a heat treatment at 400° C. ×30 seconds. Physical properties of these deionized and heat-treated wholly aromatic synthetic fibers are shown in Table 1. The fibers thus obtained in Example 1 were cut to staple fibers and made into fibrous paper together with a binder. The paper was hot pressed with a calendering machine and impregnated with an epoxy resin varnish and dried to provide a prepreg useful for preparation of printed circuit board. The prepregs were laminated and shaped into circuit boards. The result of evaluating their insulation reliability is shown in Table 2.

COMPARATIVE EXAMPLE 1

Example 1 was repeated except that the sample was given a heat treatment of 180° C. ×15 seconds immediately after the neutralization treatment, the intervening low-temperature drying being omitted. Physical properties of so obtained wholly aromatic synthetic fibers were as shown in Table 1. The fibers were then cut to staple fibers and processed into a fibrous paper together with a binder, hot-processed with a calendering machine, impregnated with a heat-curable epoxy resin varnish and formed into a prepreg useful for preparing circuit boards. The prepregs were laminated and shaped into a circuit board. The result of evaluating the board's electrical insulation property is shown in Table 2.

TABLE 1

|  | Example 1 | | Comparative Example 1 | |
| --- | --- | --- | --- | --- |
|  | Before deionizing treatment | After deionizing and heat treatments | Before deionizing treatment | After deionizing and heat treatments |
| Sodium content (wt %) | 0.360 | 0.023 | 0.600 | 0.540 |
| Moisture content (wt %) | 50.0 | 2.0 | 3.5 | 2.0 |
| Crystal size (110 plane) | 42 | 65 | 70 | 70 |

TABLE 2

Electrical Insulation Resistance of Circuit Board (unit: Ω)

| Moisture-absorbing treatment time (hr) | Example 1 | Comparative Example 1 |
| --- | --- | --- |
| 0 (hr) | $2 \times 10^{12}$ | $6 \times 10^{12}$ |
| 500 (hr) | $1 \times 10^{12}$ | $1 \times 10^{<7}$ |
| 1000 (hr) | $1 \times 10^{12}$ | $1 \times 10^{<7}$ |

The results as shown in Tables 1 and 2 indicate that the deionizing treatment conducted before the heat treatment of wholly aromatic synthetic fibers reduces said fiber's ionic substance content and enables production of wholly aromatic synthetic fibers excelling in insulation properties.

What is claimed is:

1. Wholly aromatic synthetic fibers spun from liquid-crystalline polymer solutions, characterized by having a crystal size (110 plane) of 50Å or less and an ionic substance content of 1.0 wt % or less.

2. Wholly aromatic synthetic fibers according to claim 1, where said wholly aromatic synthetic fibers spun from a liquid-crystalline polymer solution are polyparaphenylene terephthalamide fibers.

3. Wholly aromatic synthetic fibers according to claim 1, where said wholly aromatic synthetic fibers spun from a liquid-crystalline polymer solution are polyparaphenylene benzobisoxazole fibers.

4. Wholly aromatic synthetic fibers according to any one of claims 1 to 3, whose moisture content ranges 15–300 wt %.

5. Wholly aromatic synthetic fibers spun from liquid-crystalline polymer solutions characterized in that the fibers according to any one of claims 1 to 4 are given a deionizing treatment to have an ionic substance content reduced to 0.2 wt % or less.

6. Wholly aromatic synthetic fibers spun from liquid-crystalline polymer solutions characterized by having a crystal size greater than 50 Å, which are obtained by heat-treating the fibers of claim 5.

7. Insulating and low dielectric materials characterized by comprising the wholly aromatic synthetic fibers spun from liquid-crystalline polymer solutions, which are described in claim 5.

8. Cord characterized by comprising the wholly aromatic synthetic fibers spun from liquid-crystalline polymer solutions, which are described in claim 5.

9. Fabric characterized by comprising the wholly aromatic synthetic fibers spun from liquid-crystalline polymer solutions, which are described in claim 5.

10. Sheet-form structures for electric circuit boards characterized by comprising the wholly aromatic synthetic fibers spun from liquid-crystalline polymer solutions, which are described in claim 5.

* * * * *